United States Patent
Iguchi et al.

(10) Patent No.: US 11,608,438 B2
(45) Date of Patent: Mar. 21, 2023

(54) LOW-DIELECTRIC HEAT DISSIPATION FILM COMPOSITION AND LOW-DIELECTRIC HEAT DISSIPATION FILM

(71) Applicant: SHIN-ETSU CHEMICAL CO., LTD., Tokyo (JP)

(72) Inventors: Hiroyuki Iguchi, Annaka (JP); Yoshinori Takamatsu, Annaka (JP); Yuki Kudo, Annaka (JP); Atsushi Tsuura, Annaka (JP); Yoshihiro Tsutsumi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 437 days.

(21) Appl. No.: 16/828,779

(22) Filed: Mar. 24, 2020

(65) Prior Publication Data

US 2020/0325334 A1 Oct. 15, 2020

(30) Foreign Application Priority Data

Apr. 10, 2019 (JP) .............................. JP2019-074644

(51) Int. Cl.
| | |
|---|---|
| *C08L 79/08* | (2006.01) |
| *C08G 73/12* | (2006.01) |
| *C08K 3/38* | (2006.01) |
| *C08J 5/18* | (2006.01) |
| *H05K 1/02* | (2006.01) |

(52) U.S. Cl.
CPC .......... *C08L 79/085* (2013.01); *C08G 73/128* (2013.01); *C08J 5/18* (2013.01); *C08K 3/38* (2013.01); *C08J 2379/08* (2013.01); *C08K 2003/385* (2013.01); *C08K 2201/001* (2013.01); *C08K 2201/016* (2013.01); *C08L 2203/16* (2013.01); *C08L 2203/20* (2013.01); *H05K 1/0203* (2013.01)

(58) Field of Classification Search
None
See application file for complete search history.

(56) References Cited

U.S. PATENT DOCUMENTS

| | | | |
|---|---|---|---|
| 2016/0060112 A1* | 3/2016 | Nishi ...................... | C08K 3/38 252/74 |
| 2018/0009195 A1* | 1/2018 | Takeuchi ................ | B32B 27/34 |
| 2019/0153224 A1* | 5/2019 | NAKAZUMI ...... | H05K 1/0373 |

FOREIGN PATENT DOCUMENTS

| | | |
|---|---|---|
| JP | 2010-059363 A | 3/2010 |
| JP | 2010-275342 A | 12/2010 |
| JP | 2012-255059 A | 12/2012 |
| JP | WO2016/114287 A1 | 9/2017 |

* cited by examiner

*Primary Examiner* — Robert T Butcher
(74) *Attorney, Agent, or Firm* — Oliff PLC (57) ABSTRACT

A low-dielectric heat dissipation film composition contains: (A) a maleimide resin composition containing (A1) a maleimide resin containing at least two or more maleimide groups per molecule and (A2) a polymerization initiator; and (B) boron nitride particles. The component (A1) has a maleimide equivalent of not more than 0.1 mol/100 g, and a cured material of the component (A) has a relative dielectric constant of 3.5 or less at a frequency of 10 GHz. Thus, the present invention provides a film composition for forming a film having low dielectric constant and high heat dissipation.

10 Claims, 1 Drawing Sheet

[FIG. 1]

Boron nitride particles with hexagonal crystal structure

[FIG. 2]

LOW-DIELECTRIC HEAT DISSIPATION FILM COMPOSITION AND LOW-DIELECTRIC HEAT DISSIPATION FILM

TECHNICAL FIELD

The present invention relates to a low-dielectric heat dissipation film composition and a low-dielectric heat dissipation film.

BACKGROUND ART

Recently, in mobile communication devices typified by cellular phones, network infrastructure devices such as base station devices therefor, servers, and routers, as well as electronic devices such as large computers, the speed and capacity of signals to be processed and stored are have been increased year after year. Accordingly, printed circuit boards mounted on these electronic devices need to be compatible with high frequencies around 20 GHz, and there are demands for substrate materials having low relative dielectric constant and low dielectric tangent, which enable transmission loss reduction. Besides the aforementioned electronic devices, in the fields of intelligent transportation system (ITS) (related to automobile, traffic system) and in-room near-field communication also, the practical application and practical planning of new systems dealing with high-frequency radio signals have been advancing, so that substrate materials with low transmission loss are demanded for printed circuit boards mounted on devices in these systems, too. In addition, the above electronic devices and printed circuit boards generate heat considerably, which in turn decreases the performances. Hence, the materials to be used need to have high heat dissipation.

Generally-used, highly heat-conductive fillers made of metal oxide, metal nitride, or the like have high relative dielectric constant and are not suitable to the high frequency-compatible material. Meanwhile, it is known that boron nitride has low relative dielectric constant and very high heat conductivity in an a-axis direction. Nevertheless, boron nitride has low heat conductivity in a c-axis direction. Further, it is difficult to synthesize spherical boron nitride. Hence, when a resin composition is formed using boron nitride, high heat conductivity is not attained.

For printed circuit boards required to have low transmission loss, a polyphenylene ether (PPE) resin, a maleimide resin, and a fluororesin, which exhibit excellent high-frequency characteristics, have been used. However, the heat conductivity of these materials is low and not sufficient for high frequency-compatible materials (Patent Documents 1 to 4).

CITATION LIST

Patent Literature

Patent Document 1: Japanese Unexamined Patent Application Publication No. 2010-59363
Patent Document 2: Japanese Unexamined Patent Application Publication No. 2010-275342
Patent Document 3: Japanese Unexamined Patent Application Publication No. 2012-255059
Patent Document 4: Re-publication of PCT International Publication No. 2016-114287

SUMMARY OF INVENTION

Technical Problem

The present invention has been made to solve the above-described problems. An object of the present invention is to provide a film composition for forming a film having low dielectric constant and high heat dissipation.

Solution to Problem

To achieve the object, the present invention provides a low-dielectric heat dissipation film composition comprising the following components (A) and (B):

(A) a maleimide resin composition containing the following components (A1) and (A2),
  (A1) a maleimide resin containing at least two or more maleimide groups per molecule, and
  (A2) a polymerization initiator; and
(B) boron nitride particles,
wherein the component (A1) has a maleimide equivalent of not more than 0.1 mol/100 g, and
a cured material of the component (A) has a relative dielectric constant of 3.5 or less at a frequency of 10 GHz.

This low-dielectric heat dissipation film composition provides a film having low relative dielectric constant and high thermal conductivity.

The boron nitride particles of the component (B) preferably comprise boron nitride particles with hexagonal crystal structure.

When the boron nitride particles of the component (B) include boron nitride particles having hexagonal crystal structure, the low-dielectric heat dissipation film composition provides a film having high heat conductivity by utilizing the characteristic of high heat conductivity in an a-axis direction of the boron nitride particles with hexagonal crystal structure.

The maleimide resin of the component (A1) preferably has a main chain containing an alkylene chain or an arylene chain with 12 or more carbon atoms.

The maleimide resin of the component (A1) having such a main chain containing an alkylene chain or an arylene chain with 12 or more carbon atoms makes it possible to suppress the relative dielectric constant of the cured material of the component (A).

Preferably, the boron nitride particles of the component (B) have a ratio Ia/Ic of 0.25 or more,
Ia represents an intensity in an a-axis direction (100 plane), and
Ic represents an intensity in a c-axis direction (002 plane), Ia and Ic being measured using an X-ray diffractometer.

When the ratio Ia/Ic of the boron nitride particles of the component (B) is 0.25 or more, the low-dielectric heat dissipation film composition provides a film having high heat conductivity in a thickness direction of the film.

Preferably, the low-dielectric heat dissipation film composition further comprises (C) at least one selected from epoxy resins, phenylene ether resins, styrene resins, and phenol resins.

The low-dielectric heat dissipation film composition containing the component (C) provides a film having lower relative dielectric constant and higher thermal conductivity.

Further, the present invention provides a low-dielectric heat dissipation film comprising a material formed from the above-described low-dielectric heat dissipation film composition.

This low-dielectric heat dissipation film has low relative dielectric constant and high thermal conductivity.

The low-dielectric heat dissipation film preferably has different heat conductivities in a plane direction and in a thickness direction by 0.5 W/m·K or more.

When the difference in the heat conductivities is 0.5 W/m·K or more, at least some of the boron nitride particles are oriented in (parallel to) the thickness direction of the film, so that this low-dielectric heat dissipation film has anisotropic thermal conductivity.

Advantageous Effects of Invention

The present invention makes it possible to provide a film composition for forming a film with low relative dielectric constant and high heat conductivity.

DESCRIPTION OF EMBODIMENTS

As described above, there have been demands for the development of a film composition for forming a film having low dielectric constant and high heat dissipation.

The present inventors have earnestly studied the above problems and consequently found that the problems can be solved by a low-dielectric heat dissipation film composition containing the following components (A) and (B). The component (A) is a maleimide resin composition containing the following components (A1) and (A2). The component (B) is boron nitride particles. The component (A1) is a maleimide resin containing at least two or more maleimide groups in one molecule, and the component (A2) is a polymerization initiator. The component (A1) has a maleimide equivalent of not more than 0.1 mol/100 g, and a cured material of the component (A) has a relative dielectric constant of 3.5 or less at a frequency of 10 GHz. This finding has led to the completion of the present invention.

That is, the present invention is a low-dielectric heat dissipation film composition comprising the following components (A) and (B):

(A) a maleimide resin composition containing the following components (A1) and (A2), (A1) a maleimide resin containing at least two or more maleimide groups per molecule, and (A2) a polymerization initiator; and (B) boron nitride particles, wherein the component (A1) has a maleimide equivalent of not more than 0.1 mol/100 g, and a cured material of the component (A) has a relative dielectric constant of 3.5 or less at a frequency of 10 GHz.

Hereinafter, the inventive composition for a low-dielectric heat dissipation film will be described in detail.

[(A) Maleimide Resin Composition]

The component (A) of the present invention is a main component of the inventive low-dielectric heat dissipation film composition, and contains two components: (A1) a maleimide resin containing at least two or more maleimide groups per molecule; and (A2) a polymerization initiator.

(A1) Maleimide Resin Containing at Least Two or More Maleimide Groups Per Molecule The component (A1) of the present invention contains at least two or more, preferably 2 to 4, maleimide groups per molecule and has a maleimide equivalent of not more than 0.1 mol/100 g. The maleimide equivalent is preferably not more than 0.08 mol/100 g, further preferably 0.001 to 0.06 mol/100 g. If the maleimide equivalent exceeds 0.1 mol/100 g, the relative dielectric constant of the cured material of the component (A) cannot be suppressed and not preferable. The maleimide equivalent is calculated from integrated values of hydrogen atoms with dimethyl sulfoxide used as the internal standard after measurement of a $^1$H-NMR spectrum of the compound at 400 MHz, for example.

The component (A1) has a main chain containing an alkylene chain or an arylene chain with preferably 12 or more carbon atoms, more preferably 14 to 50 carbon atoms. The number of carbon atoms within this range is preferable because the cured material of the component (A) to be obtained has a lower relative dielectric constant.

Examples of the maleimide of the component (A1) include maleimide compounds as shown by (1) below.

(1)

In the formula (1), A's each independently represent a tetravalent organic group containing a cyclic structure. B's each independently represent an alkylene group having 6 or more carbon atoms optionally containing a divalent heteroatom. Q's each independently represent an arylene group having 6 or more carbon atoms optionally containing a divalent heteroatom. W represents B or Q. "n" represents a number from 0 to 100, and "m" represents a number from 0 to 100. Note that at least one of "n" and "m" is a positive number.

A, which represents a tetravalent organic group containing a cyclic structure in the formula (1), is particularly preferably any of tetravalent organic groups shown by the following structural formulae.

-continued

Note that bonding arms, to which no substituent in the structural formulae is bonded, are bonded to carbonyl carbons which form cyclic imide structures in the general formula (1).

Moreover, B's, which each independently represents an alkylene group having 6 or more carbon atoms optionally containing a divalent heteroatom in the formula (1), is preferably an alkylene group having 8 or more carbon atoms. Each B in the formula (1) is further preferably any of alkylene groups having aliphatic rings shown by the following structural formulae.

-continued

Note that bonding arms, to which no substituent in the structural formulae is bonded, are bonded to nitrogen atoms which form cyclic imide structures in the general formula (1).

Q's, which each independently represent an arylene group having 6 or more carbon atoms optionally containing a divalent heteroatom, is preferably an arylene group having 8 or more carbon atoms. Each Q in the formula (1) is further preferably any of arylene groups having an aromatic ring(s) shown by the following structural formulae.

"n" in the formula (1) represents a number from 0 to 100, preferably 0 to 70. "m" in the formula (1) represents a number from 0 to 100, preferably 0 to 70. Note that at least one of "n" and "m" is a positive number.

As the high-molecular-weight maleimide, commercially available products such as BMI-2500, BMI-2560, BMI-3000, BMI-5000, BMI-6000, and BMI-6100 (these are available from Designer Molecules Inc.) are usable. Moreover, one kind of the cyclic imide compound may be used alone, or multiple kinds thereof may be used in combination.

(A2) Polymerization Initiator

The component (A2) of the present invention is a reaction initiator for curing the low-dielectric heat dissipation film composition. The polymerization initiator (A2) is not particularly limited, and examples thereof include thermal radical polymerization initiators, thermal cation polymerization initiators, thermal anion polymerization initiators, photopolymerization initiators, etc.

Examples of the thermal radical polymerization initiators include organic peroxides such as methyl ethyl ketone peroxide, methylcyclohexanone peroxide, methyl acetoacetate peroxide, acetylacetone peroxide, 1,1-bis(t-butylperoxy)3,3,5-trimethylcyclohexane, 1,1-bis(t-hexylperoxy)cyclohexane, 1,1-bis(t-hexylperoxy)3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclododecane, n-butyl-4,4-bis(t-butylperoxy)valerate, 2,2-bis(t-butylperoxy)butane, 1,1-bis(t-butylperoxy)-2-methylcyclohexane, t-butyl hydroperoxide, p-menthane hydroperoxide, 1,1,3,3-tetramethylbutyl hydroperoxide, t-hexyl hydroperoxide, dicumyl peroxide, 2,5-dimethyl-2,5-bis(t-butylperoxy)hexane, a, a'-bis(t-butylperoxy)diisopropylbenzene, t-butyl cumyl peroxide, di-t-butyl peroxide, 2,5-dimethyl-2,5-bis(t-butylperoxy)hexyne-3, isobutyryl peroxide, 3,5,5-trimethylhexanoyl peroxide, octanoyl peroxide, lauroyl peroxide, cinnamoyl peroxide, m-toluoyl peroxide, benzoyl peroxide, diisopropyl peroxydicarbonate, bis(4-t-butylcyclohexyl)peroxydicarbonate, di-3-methoxybutyl peroxydicarbonate, di-2-ethylhexyl peroxydicarbonate, di-sec-butyl peroxydicarbonate, di(3-methyl-3-methoxybutyl)peroxydicarbonate, di(4-t-butylcyclohexyl) peroxydicarbonate, α, α'-bis(neodecanoylperoxy) diisopropylbenzene, cumyl peroxyneodecanoate, 1,1,3,3,-tetramethylbutyl peroxyneodecanoate, 1-cyclohexyl-1-methylethyl peroxyneodecanoate, t-hexyl peroxyneodecanoate, t-butyl peroxyneodecanoate, t-hexyl peroxypivalate, t-butyl peroxypivalate, 2,5-dimethyl-2,5-bis (2-ethylhexanoyl peroxy)hexane, 1,1,3,3-tetramethylbutyl peroxy-2-ethylhexanoate, 1-cyclohexyl-1-methylethyl peroxy-2-ethylhexanoate, t-hexylperoxy-2-ethylhexanoate, t-butylperoxy-2-ethylhexanoate, t-butyl peroxyisobutyrate, t-butyl peroxymaleic acid, t-butyl peroxylaurate, t-butyl peroxy-3,5,5-trimethylhexanoate, t-butyl peroxyisopropyl monocarbonate, t-butylperoxy-2-ethylhexyl monocarbonate, 2,5-dimethyl-2,5-bis(benzoylperoxy)hexane, t-butyl peroxyacetate, t-hexyl peroxybenzoate, t-butyl peroxy-m-toluoylbenzoate, t-butyl peroxybenzoate, bis(t-butylperoxy) isophthalate, t-butyl peroxy allyl monocarbonate, and 3,3', 4,4'-tetra(t-butylperoxycarbonyl)benzophenone; and azo compounds such as 2,2'-azobis(N-butyl-2-methylpropionamide), 2,2'-azobis(N-cyclohexyl-2-methylpropionamide), 2,2'-azobis[N-(2-methylpropyl)-2-methylpropionamide], 2,2'-azobis[N-(2-methylethyl)-2-methylpropionamide], 2,2'-azobis(N-hexyl-2-methylpropionamide), 2,2'-azobis(N-propyl-2-methylpropionamide), 2,2'-azobis(N-ethyl-2-methylpropionamide), 2,2'-azobis[2-methyl-N-(2-hydroxyethyl)propionamide], 2,2'-azobis[N-(2-propenyl)-2-methylpropionamide], 2,2'-azobis{2-methyl-N-[1,1-bis (hydroxymethyl)-2-hydroxyethyl]propionamide}, 2,2'-azobis[N-(2-propenyl)-2-methylpropionamide], and dimethyl-1,1'-azobis(1-cyclohexanecarboxylate); preferably, dicumyl peroxide, di-t-butyl peroxide, isobutyryl peroxide, 2,2'-azobis(N-butyl-2-methylpropionamide), and 2,2'-azobis[N-(2-methylethyl)-2-methylpropionamide]; further preferably, dicumyl peroxide, di-t-butyl peroxide, and isobutyryl peroxide.

Examples of the thermal cation polymerization initiators include aromatic iodonium salts such as (4-methylphenyl) [4-(2-methylpropyl)phenyl]iodonium cation, (4-methylphenyl)(4-isopropylphenyl)iodonium cation, (4-methylphenyl)(4-isobutyl)iodonium cation, bis(4-t-butyl)iodonium cation, bis(4-dodecylphenyl)iodonium cation, and (2,4,6-trimethylphenyl)[4-(1-methyl acetate ethyl ether)phenyl]iodonium cation; aromatic sulfonium salts such as diphenyl[4-(phenylthio)phenyl]sulfonium cation, triphenylsulfonium cation, and alkyltriphenylsulfonium cation; preferably (4-methylphenyl)[4-(2-methylpropyl)phenyl]iodonium cation, (4-methylphenyl)(4-isopropylphenyl)iodonium cation, triphenylsulfonium cation, and alkyltriphenylsulfonium cation; further preferably (4-methylphenyl)[4-(2-methylpropyl)phenyl]iodonium cation, and (4-methylphenyl)(4-isopropylphenyl)iodonium cation.

Examples of the thermal anion polymerization initiators include imidazoles such as 2-methylimidazole, 2-ethylimidazole, 2-phenylimidazole, 2-ethyl-4-methylimidazole, 2-undecylimidazole, and 1-cyanoethyl-2-ethyl-4-methylimidazole; amines such as triethylamine, triethylenediamine, 2-(dimethylaminomethyl)phenol, 1,8-diaza-bicyclo (5,4,0)undecene-7, tris(dimethylaminomethyl)phenol, and benzyldimethylamine; phosphines such as triphenylphosphine, tributylphosphine, and trioctylphosphine; preferably, 2-methylimidazole, 2-ethyl-4-methylimidazole, triethylamine, triethylenediamine, 1,8-diaza-bicyclo(5,4,0)undecene-7, triphenylphosphine, tributylphosphine; further preferably 2-ethyl-4-methylimidazole, 1,8-diaza-bicyclo(5,4,0)undecene-7, and triphenylphosphine.

The photopolymerization initiators are not particularly limited, and examples thereof include: benzoyl compounds (or phenyl ketone compounds) such as benzophenone; particularly, benzoyl compounds (or phenyl ketone compounds) having a hydroxy group on the α-position carbon atom of the carbonyl group such as 1-hydroxycyclohexyl phenyl ketone, 2-hydroxy-2-methyl-1-phenylpropan-1-one, and 1-(4-isopropylphenyl)-2-hydroxy-2-methylpropan-1-one; α-alkylaminophenone compounds such as 2-methyl-1-(4-methylthiophenyl)-2-morpholinopropan-1-one, 2-benzyl-2-dimethylamino-1-(4-morpholinophenyl)-1-butanone, and 2-dimethylamino-2-(4-methyl-benzyl)-1-(4-morpholin-4-yl-phenyl)-butan-1-one; acylphosphine oxide compounds such as 2,4,6-trimethylbenzoyl diphenylphosphine oxide, bisacylmonoorganophosphine oxide, and bis(2,6-dimethoxybenzoyl)-2,4,4,-trimethylpentylphosphine oxide; benzoin ether compounds such as isobutyl benzoin ether; ketal compounds such as acetophenone diethyl ketal; thioxanthone-based compounds; and acetophenone-based compounds; etc. Particularly, since UV-LED generates radiation with single wavelengths, when UV-LED is used as a light source, it is effective to use a photopolymerization initiator of an α-alkylaminophenone compound or an acylphosphine oxide compound having an absorption spectrum peak in the region of 340 to 400 nm.

One kind of these components (A2) may be used alone, or two or more kinds thereof may be used in combination. The content of the component (A2) is not particularly limited, but is preferably 0.01 to 10 parts by mass, more preferably 0.05 to 8 parts by mass, further preferably 0.1 to 5 parts by mass, relative to 100 parts by mass of the component (A1). When the content is within this range, the low-dielectric heat dissipation film composition can be cured sufficiently; furthermore, it is easy to keep the low dielectric constant of the low-dielectric heat dissipation film.

Further, the cured material of the bismaleimide resin composition of the component (A) has a relative dielectric constant of 3.5 or less, preferably 3.3 or less, further preferably 2.0 or more and 3.0 or less, at a frequency of 10 GHz. If the relative dielectric constant exceeds 3.5, the dielectric constant of the low-dielectric heat dissipation film composition is high and not preferable.

Note that, in the present invention, a relative dielectric constant refers to a value obtained by, for example, curing a measurement target composition at 180° C. for 2 hours, preparing a test piece having a length of 30 mm, a width of 40 mm, and a thickness of 100 μm from the cured material, and connecting the test piece to a network analyzer (E5063-2D5 manufactured by Keysight Technologies) and a strip line (manufactured by Keycom Corporation) for the measurement of the relative dielectric constant.

[(B) Boron Nitride Particles]

The component (B) of the present invention is to increase the heat conductivity of the inventive low-dielectric heat dissipation film.

Figure 1:
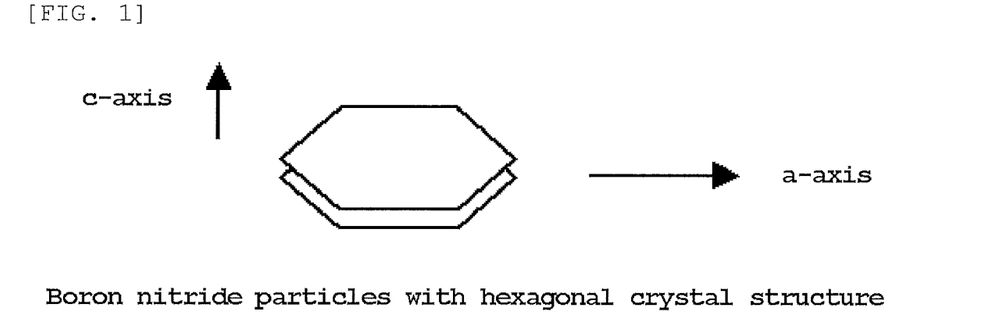
FIG. 1 is an image diagram of hexagonal boron nitride particles.

The boron nitride particles (B) are not particularly limited, but preferably include boron nitride particles with hexagonal crystal structure. Boron nitride particles having hexagonal crystal structure are known to have high heat conductivity in the a-axis direction. By utilizing this characteristic, a film having high heat conductivity is obtained (see FIG. 1).

The aspect ratio between the a-axis direction and the c-axis direction of the boron nitride particles with hexagonal crystal structure is not particularly limited, but is preferably 2 or more, further preferably 5 to 10,000.

When the aspect ratio is 2 or more, the boron nitride particles (B) are not spherical, so that the high heat conductivity in the a-axis direction is obtained. Meanwhile, when the aspect ratio is 10,000 or less, high filling ratio is achievable. Note that an aspect ratio herein is a ratio of an average major diameter to an average minor diameter which are calculated from major diameters and minor diameters of 100 boron nitride particles measured by scanning electron microscope method (SEM, for example, 3D Real Surface View microscope VE-8800 manufactured by Keyence Corporation is usable), for example.

Furthermore, the boron nitride particles have a ratio Ia/Ic of preferably 0.25 or more, further preferably 0.3 to 50, where Ia represents an intensity in the a-axis direction (100 plane), and Ic represents an intensity in the c-axis direction (002 plane), the intensities Ia and Ic being measured using an X-ray diffractometer. When such ratio is attained, a film having high heat conductivity in a thickness direction of the film is obtained. Note that the intensity ratio Ia/Ic is measured using, for example, an X-ray diffractometer SmartLab (manufactured by Rigaku Corporation). Specifically, the scanning is performed with 2θ=10° to 90° under conditions of Cu Kα line, 45 kV, and 100 mA. Then, a diffraction peak intensity Ia corresponding to the a-axis direction (100 plane) of the boron nitride particles at 41.6° and a diffraction peak intensity Ic corresponding to the c-axis direction (002 plane) of the boron nitride particles at 26.8° were computed, based on which a value of the intensity ratio Ia/Ic is calculated.

Figure 2:
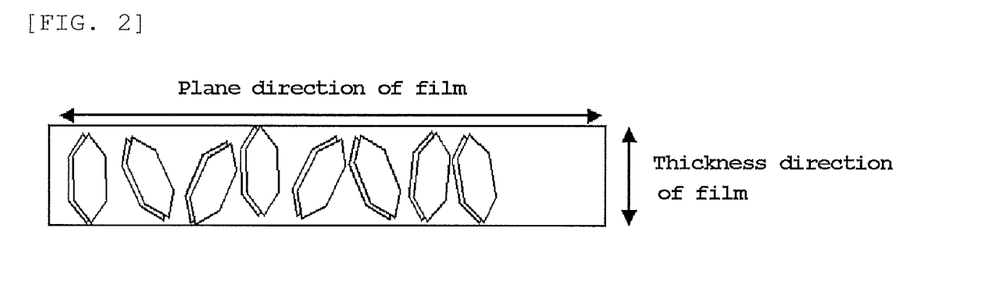
FIG. 2 is an image diagram of a film in which the boron nitride particles are oriented.

Further, measuring a difference in heat conductivity between the plane direction and the thickness direction of the film also helps to find the orientation state of the boron nitride particles. When the heat conductivity difference between the plane direction and the thickness direction of the film is measured, the heat conductivities preferably differ by 0.5 W/m·K or more, further preferably 1 W/m·K or more. When the difference is 0.5 W/m·K or more, at least some of the boron nitride particles are oriented in the thickness direction of the film, thereby imparting anisotropy to the thermal conductivity (see FIG. 2).

Note that, in the present invention, a heat conductivity can be a value measured in accordance with JIS R 1611: 2010 by laser flash method (apparatus name: LFA 447 Nanoflash manufactured by Netzsch Geratebau GmbH), for example.

Further, boron nitride particles having different shapes may be used in combination. The shapes of boron nitride particles used in combination are not particularly limited. Examples thereof include scaly shape, granular shape, spherical shape, fibrous shape, elliptical shape, etc. Among these, scaly shape, granular shape, spherical shape, and elliptical shape are preferable, and scaly shape and granular shape are further preferable. These shapes facilitate the filling of the composition with the boron nitride particles at high percentage. Moreover, the boron nitride particles may be used in the form of primary particles or aggregate.

The average particle diameter of the boron nitride particles is not particularly limited. For example, the median diameter measured with a laser diffraction type particle size distribution measurement apparatus is preferably 0.01 to 500 μm, more preferably 0.05 to 300 μm, further preferably 0.1 to 100 μm. When the average particle diameter is within this range, high filling ratio with the boron nitride particles is achievable. Additionally, two or more kinds of boron nitride particles having different particle diameters may be used in combination.

The component (B) is blended in an amount of preferably 50 to 2,000 parts by mass, more preferably 100 to 1,500 parts by mass, relative to 100 parts by mass of the maleimide resin composition of the component (A).

To improve the kneadability, compatibility, etc. with the resin, the boron nitride particles treated with a surface treatment agent such as a silane coupling agent may be used. Examples of the silane coupling agent include alkyl group-modified alkoxysilanes such as methyltrimethoxysilane, methyltriethoxysilane, n-propyltrimethoxysilane, n-propyl- triethoxysilane, n-octyltrimethoxysilane, and n-octyltriethoxysilane; aryl group-modified alkoxysilanes such as phenyltrimethoxysilane and phenyltriethoxysilane; amino group-modified alkoxysilanes such as 3-aminopropyltrimethoxysilane and N-phenyl-3-aminopropyltrimethoxysilane; polyether-modified alkoxysilanes such as 3-[(ω-methoxy(polyoxyethylene)]propyltrimethoxysilane and co-methoxytri(oxyethylene)propyltrimethoxysilane; mercapto group-containing alkoxysilanes such as 3-mercaptopropyltrimethoxysilane; (meth)acryl group-modified alkoxysilanes such as 3-(methacryloyloxy) propyltrimethoxysilane and 3-(acryloyloxy) propyltriethoxysilane; isocyanato group-containing alkoxysilanes such as 3-isocyanatopropyltriethoxysilane and 3-isocyanatopropyltrimethoxysilane; epoxy group-modified alkoxysilanes such as glycidoxypropyltrimethoxysilane and 2-(3,4-epoxy cyclohexyl)ethyltriethoxysilane; etc.

[(C) Component]

The present invention may further contain a component (C), which is at least one selected from epoxy resins, phenylene ether resins, styrene resins, and phenol resins.

The epoxy resins are not particularly limited, and it is possible to use commonly known epoxy resins having two or more epoxy groups per molecule. Examples thereof include bisphenol A type epoxy resins, bisphenol E type epoxy resins, bisphenol F type epoxy resins, bisphenol S type epoxy resins, naphthalene skeleton-modified novolak type epoxy resins, phenol novolak type epoxy resins, cresol novolak type epoxy resins, xylene novolak type epoxy resins, bisphenol A novolak type epoxy resins, brominated bisphenol A type epoxy resins, brominated phenol novolak type epoxy resins, trifunctional phenol type epoxy resins, tetrafunctional phenol type epoxy resins, naphthalene type epoxy resins, naphthylene ether type epoxy resins, biphenyl type epoxy resins, phenol aralkyl type epoxy resins, biphenyl aralkyl type epoxy resins, naphthol aralkyl type epoxy resins, alicyclic epoxy resins, dicyclopentadiene type epoxy resins, aralkyl novolak type epoxy resins, and polyol type epoxy resins. Among these, preferable are bisphenol A type epoxy resins, bisphenol F type epoxy resins, naphthalene skeleton-modified novolak type epoxy resins, phenol novolak type epoxy resins, cresol novolak type epoxy resins, bisphenol A novolak type epoxy resins, biphenyl type epoxy resins, phenol aralkyl type epoxy resins, biphenyl aralkyl type epoxy resins, alicyclic epoxy resins, and dicyclopentadiene type epoxy resins; further preferable are bisphenol A type epoxy resins, bisphenol F type epoxy resins, phenol novolak type epoxy resins, biphenyl type epoxy resins, alicyclic epoxy resins, and dicyclopentadiene type epoxy resins.

The phenylene ether resins are not particularly limited, and an example thereof includes a resin containing a structure shown by the following formula (2).

(2)

$R^1$ to $R^8$ each independently represent a hydrogen atom or a group selected from a saturated hydrocarbon group having 1 to 12 carbon atoms and an aromatic hydrocarbon group having 6 to 12 carbon atoms; preferably, a hydrogen atom, a saturated hydrocarbon group having 1 to 6 carbon atoms, or an aromatic hydrocarbon group having 6 to 12 carbon atoms; further preferably, a hydrogen atom or a saturated hydrocarbon group having 1 to 6 carbon atoms. Examples of the saturated hydrocarbon group include alkyl groups such as a methyl group, an ethyl group, a propyl group, and a butyl group; cycloalkyl groups such as a cyclopentyl group and a cyclohexyl group; and these groups in which part or all of hydrogen atoms bonded to carbon atoms thereof are substituted with a cyano group, a glycidyloxy group, a mercapto group, an amino group, a halogen atom such as fluorine, bromine, and chlorine, or the like, and examples of which include halogenated monovalent saturated hydrocarbon groups such as a trifluoropropyl group and a chloropropyl group; cyanoalkyl groups such as a β-cyanoethyl group and a γ-cyanopropyl group; a 3-glycidyloxypropyl group, a 3-mercaptopropyl group, a 3-aminopropyl group, etc. Among these, a methyl group, a cyclohexyl group, and the like are preferable, and a methyl group is particularly preferable. Examples of the aromatic hydrocarbon group include aryl groups such as a phenyl group, a tolyl group, a naphthyl group, and a biphenyl group; aralkyl groups such as a benzyl group, a phenylethyl group, and a phenylpropyl group; etc. In these groups, part or all of hydrogen atoms bonded to carbon atoms thereof may be substituted with a cyano group or a halogen atom such as fluorine, bromine, and chlorine. Among these, at least one of $R^1$ to $R^8$ is preferably a group selected from a hydrogen atom and a methyl group.

n' represents an integer of 1 to 30, preferably 1 to 20, further preferably 1 to 10. m' represents an integer of 0 to 30, preferably 0 to 20, further preferably 0 to 10. The values in these ranges are preferable because when the phenylene ether resin (c) is added to the low-dielectric heat dissipation film composition, the viscosity is hardly increased.

X represents a group selected from a single bond and a saturated hydrocarbon group having 1 to 12 carbon atoms, preferably a single bond or a saturated hydrocarbon group having 1 to 6 carbon atoms. The saturated hydrocarbon group is as defined above for $R^1$ to $R^8$.

The styrene resins are not particularly limited, and an example thereof includes a resin containing a structure shown by the following formula (3).

(3)

$R^9$ represents a hydrogen atom or a group selected from a saturated hydrocarbon group having 1 to 12 carbon atoms, an alkenyl group having 1 to 12 carbon atoms, and an aromatic hydrocarbon group having 6 to 12 carbon atoms; preferably, a hydrogen atom, a saturated hydrocarbon group having 1 to 6 carbon atoms, an alkenyl group having 1 to 10 carbon atoms, or an aromatic hydrocarbon group having 6 to 12 carbon atoms; further preferably, a hydrogen atom, a saturated hydrocarbon group having 1 to 6 carbon atoms, or an alkenyl group having 1 to 10 carbon atoms. Examples of the saturated hydrocarbon group include alkyl groups such as a methyl group, an ethyl group, a propyl group, and a butyl group; cycloalkyl groups such as a cyclopentyl group and a cyclohexyl group; and these groups in which part or all of hydrogen atoms bonded to carbon atoms thereof are substituted with a cyano group, a glycidyloxy group, a mercapto group, an amino group, a halogen atom such as fluorine, bromine, and chlorine, or the like, and examples of which include halogenated monovalent saturated hydrocarbon groups such as a trifluoropropyl group and a chloropropyl group; cyanoalkyl groups such as a β-cyanoethyl group and a γ-cyanopropyl group; a 3-glycidyloxypropyl group, a 3-mercaptopropyl group, a 3-aminopropyl group, etc. Among these, a methyl group, a cyclohexyl group, and the like are preferable, and a methyl group is particularly preferable. Examples of the alkenyl group include a vinyl group, an allyl group, a propenyl group, a hexenyl group, a styryl group, a cyclopentenyl group, a cyclohexenyl group, a dicyclopentenyl group, etc. Among these, a vinyl group, a styryl group, and a cyclopentenyl group are preferable. Examples of the aromatic hydrocarbon groups include aryl groups such as a phenyl group, a tolyl group, a naphthyl group, and a biphenyl group; aralkyl groups such as a benzyl group, a phenylethyl group, and a phenylpropyl group; etc. In these groups, part or all of hydrogen atoms bonded to carbon atoms thereof may be substituted with a cyano group or a halogen atom such as fluorine, bromine, and chlorine.

The phenol resins are not particularly limited, and commonly known phenol resins may be used. Examples thereof include phenol novolak resins, naphthalene ring-containing phenol resins, phenolaralkyl type phenol resins, aralkyl type phenol resins, biphenyl skeleton-containing aralkyl type phenol resins, biphenyl type phenol resins, dicyclopentadiene type phenol resins, alicyclic phenol resins, heterocyclic phenol resins, and naphthalene ring-containing phenol resins.

When the inventive low-dielectric heat dissipation film composition is blended with the component (C), the content of the component (C) is preferably 1 to 50 parts by mass, more preferably 5 to 30 parts by mass, relative to 100 parts by mass of the maleimide resin composition of the component (A).

The inventive low-dielectric heat dissipation film composition may further contain, in addition to the above-described the components (A) to (C), an inorganic filler, an antioxidant, a flame retardant, and so forth, as necessary. Hereinbelow, each component will be described.

[Inorganic Filler]

An inorganic filler other than the boron nitride particles of the component (B) is not particularly limited. Examples thereof include silica, calcium carbonate, potassium titanate, glass fiber, silica balloon, glass balloon, aluminum oxide, aluminum nitride, beryllium oxide, barium titanate, barium sulfate, zinc oxide, titanium oxide, magnesium oxide, antimony oxide, aluminum hydroxide, magnesium hydroxide, etc.; preferably, silica, aluminum oxide, aluminum nitride, and zinc oxide. By incorporating these inorganic fillers, the coefficient of thermal expansion of the cured material of the low-dielectric heat dissipation film composition can be lowered.

The particle diameter of the inorganic filler is not particularly limited. For example, the median diameter measured with a laser diffraction type particle size distribution measurement apparatus is preferably 0.05 to 50 μm, more preferably 0.1 to 40 μm, further preferably 0.5 to 30 μm. The median diameter in this range is preferable because it is easy to uniformly disperse the inorganic filler into the low-dielectric heat dissipation film composition and because precipitation of the inorganic filler is prevented over time. Further, the particle diameter is preferably 50% or less relative to the thickness of the resulting film. The particle diameter is preferably 50% or less of the film thickness because it is easy to uniformly disperse the inorganic filler into the low-dielectric heat dissipation film composition and because it is also easy to evenly form the low-dielectric heat dissipation film by coating.

The content of the inorganic filler is not particularly limited, but is preferably 1 to 50 parts by mass, more preferably 5 to 40 parts by mass, further preferably 10 to 30 parts by mass, relative to 100 parts by mass of the maleimide resin composition of the component (A). The content in this range is preferable because the coefficient of thermal expansion of the low-dielectric heat dissipation film composition can be effectively lowered and because the completely cured film which is formed from the composition is not brittle.

[Antioxidant]

An antioxidant is not particularly limited, and examples thereof include phenol-based antioxidants such as n-octadecyl-3-(3,5-di-t-butyl-4-hydroxyphenyl)propionate, n-octadecyl-3-(3,5-di-t-butyl-4-hydroxyphenyl)acetate, neododecyl-3-(3,5-di-t-butyl-4-hydroxyphenyl)propionate, dodecyl-β-(3,5-di-t-butyl-4-hydroxyphenyl)propionate, ethyl-α-(4-hydroxy-3,5-di-t-butylphenyl)isobutyrate, octadecyl-α-(4-hydroxy-3,5-di-t-butylphenyl)isobutyrate, octadecyl-α-(4-hydroxy-3,5-di-t-butyl-4-hydroxyphenyl)propionate, 2-(n-octylthio)ethyl-3,5-di-t-butyl-4-hydroxyphenylacetate, 2-(n-octadecylthio)ethyl-3,5-di-t-butyl-4-hydroxyphenylacetate, 2-(n-octadecylthio)ethyl-3-(3,5-di-t-butyl-4-hydroxyphenyl)propionate, 2-(2-stearoyloxyethylthio)ethyl-7-(3-methyl-5-t-butyl-4-hydroxyphenyl)heptanoate, and 2-hydroxyethyl-7-(3-methyl-5-t-butyl-4-hydroxyphenyl) propionate;

sulfur-based antioxidants such as dilauryl-3,3'-thiodipropionate, dimyristyl-3,3'-thiodipropionate, distearyl-3,3'-thiodipropionate, ditridecyl-3,3'-thiodipropionate, and pentaerythrityl tetrakis(3-laurylthiopropionate); and phosphorus-based antioxidants such as tridecyl phosphite, triphenyl phosphite, tris(2,4-di-t-butylphenyl)phosphite, 2-ethylhexyl diphenyl phosphite, diphenyl tridecyl phosphite, 2,2-methylenebis(4,6-di-t-butylphenyl)octyl phosphite, distearyl pentaerythritol diphosphite, bis(2,6-di-t-butyl-4-methylphenyl)pentaerythritol diphosphite, and 2-[[2,4,8,10-tetrakis(1,1-dimethylethyl)dibenzo[d,f][1,3,2] dioxaphosphepin-6-yl]oxy]-N,N-bis[2-[[2,4,8,10-tetrakis(1, 1-dimethylethyl)dibenzo[d,f][1,3,2]dioxaphosphepin-6-yl] oxy]-ethyl]ethanamine.

The content of the antioxidant is not particularly limited, but the content in the low-dielectric heat dissipation film composition is preferably 0.00001 to 5 mass %, more preferably 0.0001 to 4 mass %, further preferably 0.001 to 3 mass %. When the content is within this range, the oxidation of the low-dielectric heat dissipation film can be prevented without changing the mechanical properties of the low-dielectric heat dissipation film composition.

[Flame Retardant]

A flame retardant is not particularly limited, and examples thereof include phosphorus-based flame retardants, metal hydrates, halogen-based flame retardants, etc.

Examples of the phosphorus-based flame retardants include inorganic, nitrogen-containing phosphorus compounds such as red phosphorus, ammonium phosphate such as monoammonium phosphate, diammonium phosphate, triammonium phosphate, ammonium polyphosphate, and phosphoramide; phosphoric acid, phosphine oxide, triphenyl phosphate, tricresyl phosphate, trixylenyl phosphate, cresyl diphenyl phosphate, cresyl di-2,6-xylenyl phosphate, resorcinol bis(diphenyl phosphate), 1,3-phenylene bis(di-2,6-xylenyl phosphate), bisphenol A-bis(diphenyl phosphate), 1,3-phenylene bis(diphenyl phosphate), divinyl phenylphosphonate, diallyl phenylphosphonate, bis(1-butenyl)phenylphosphonate, phenyl diphenylphosphinate, methyl diphenylphosphinate; phosphazene compounds such as bis(2-allylphenoxy)phosphazene and dicresyl phosphazene; melamine phosphate, melamine pyrophosphate, melamine polyphosphate, melam polyphosphate, 9,10-dihydro-9-oxa-10-phosphaphenanthrene-10-oxide, and 10-(2,5-dihydroxyphenyl)-9,10-dihydro-9-oxa-10-phosphaphenanthrene-10-oxide. Examples of the metal hydrates include aluminum hydroxide hydrate and magnesium hydroxide hydrate. Examples of the halogen-based flame retardants include hexabromobenzene, pentabromotoluene, ethylene bis(pentabromophenyl), ethylenebistetrabromophthalimide, 1,2-dibromo-4-(1,2-dibromoethyl)cyclohexane, tetrabromocyclooctane, hexabromocyclododecane, bis(tribromophenoxy)ethane, brominated polyphenylene ether, brominated polystyrene, and 2,4,6-tris(tribromophenoxy)-1,3,5-triazine.

The content of the flame retardant is not particularly limited, but the content in the low-dielectric heat dissipation film composition is preferably 0.01 to 5 mass %, more preferably 0.05 to 4 mass %, further preferably 0.1 to 3 mass %. When the content is within this range, flame resistance can be imparted to the low-dielectric heat dissipation film without changing the mechanical properties of the low-dielectric heat dissipation film composition.

[Low-Dielectric Heat Dissipation Film]

The inventive low-dielectric heat dissipation film can be easily obtained by forming a film from a low-dielectric heat dissipation film composition containing the following components (A) and (B):

(A) a maleimide resin composition containing the following components (A1) and (A2),
 (A1) a maleimide resin containing at least two or more maleimide groups per molecule, and
 (A2) a polymerization initiator; and
(B) boron nitride particles. The component (A1) has a maleimide equivalent of not more than 0.1 mol/100 g, and a cured material of the component (A) has a relative dielectric constant of 3.5 or less at a frequency of 10 GHz.

The thickness of the low-dielectric heat dissipation film is not particularly limited and can be changed depending on the particle diameter of the boron nitride particles of the component (B) to be used. The thickness is for example 10 μm to 10 mm, preferably 20 μm to 5 mm, further preferably 30 μm to 2 mm. When the thickness is 10 μm or more, the strength of the low-dielectric heat dissipation film is increased. With the thickness of 10 mm or less, the thermal resistance is low when the low-dielectric heat dissipation film is mounted.

The inventive low-dielectric heat dissipation film preferably has at least one surface with a releasable substrate pasted thereon. The releasable substrate is not particularly limited, as long as the substrate is releasable after the resin constituting the inventive low-dielectric heat dissipation film is cured or semi-cured. Examples of the substrate include fluorine-based substrates, fluorine-based films, PET films treated with a mold-releasing agent, etc.

The thickness of the releasable substrate is not particularly limited and can be selected in accordance with the purpose, but is preferably 10 μm to 1,000 μm.

Such releasable resin films are optimized depending on the kind of the insulating resin. Specific examples of the resin films include fluororesin-coated PET (polyethylene terephthalate) films, silicone resin-coated PET films, and fluorine-based resin films such as PTFE (polytetrafluoroethylene), ETFE (poly(ethylene-tetrafluoroethylene)), and CTFE (polychlorotrifluoroethylene), etc. These resin films make the inventive low-dielectric heat dissipation film easy to handle and can prevent adhesion of foreign substance such as dust.

The inventive low-dielectric heat dissipation film may be in a cured or uncured state. As a method of using the low-dielectric heat dissipation film, the releasable substrate is released when it is disposed, and the low-dielectric heat dissipation film is then sandwiched between a circuit board and a semiconductor, and subjected to thermocompression bonding or screwing, so that heat dissipation can be exhibited. The heating temperature is preferably 100° C. to 300° C., more preferably 120° C. to 250° C., further preferably 150° C. to 200° C. The compression pressure is preferably 0.01 MPa to 100 MPa, more preferably 0.05 MPa to 80 MPa, further preferably 0.1 MPa to 50 MPa.

Moreover, a cured material of the inventive low-dielectric heat dissipation film composition has a relative dielectric constant of preferably 5.0 or less, more preferably 4.8 or less, further preferably 2.0 or more and 4.5 or less, at a frequency of 10 GHz. When the relative dielectric constant is within this range, the cured material can be suitably used as a high frequency-compatible heat dissipation film.

The low-dielectric heat dissipation film has a heat conductivity of preferably 4 W/m·K or more, further preferably 6 W/m·K or more, in the thickness direction. When the heat conductivity is within this range, heat generated by electronic component is allowed to escape sufficiently.

EXAMPLE

Hereinafter, the present invention will be specifically described with reference to Examples and Comparative Examples. However, the present invention is not limited to the following Examples.

Maleimide (A1-1)

To 196 g of N-methylpyrrolidone, 200 g (1.0 mol) of 1,12-diaminododecane and 207 g (0.95 mol) of pyromellitic anhydride were added, stirred at room temperature for 3 hours, and further stirred at 150° C. for 3 hours. To the resulting solution, 196 g (2.0 mol) of maleic anhydride, 82 g (1.0 mol) of sodium acetate, and 204 g (2.0 mol) of acetic anhydride were added and stirred at 80° C. for 1 hour. Then, 500 g of toluene was added, followed by washing with water and dehydration. Subsequently, the solvent was distilled off under reduced pressure to obtain bismaleimide (A1-1) shown by the following formula (molecular weight: 3,500, maleimide equivalent: 0.057 mol/100 g).

(A1-1)

(n ≈ 8 (average value))

Maleimide (A1-2)

A maleimide compound shown by the following formula (BMI-3000, manufactured by Designer Molecules Inc., molecular weight: 4000, maleimide equivalent: 0.050 mol/100 g)

(n ≈ 5. (average value))

Maleimide (A1-3)

A maleimide compound shown by the following formula (BMI-2500, manufactured by Designer Molecules Inc., molecular weight: 3500, maleimide equivalent: 0.062 mol/100 g)

(n ≈ 3 (average value), m ≈ 3 (average value))

Maleimide (A1-4)

A maleimide compound shown by the following formula (BMI-1500, manufactured by Designer Molecules Inc., molecular weight: 2100, maleimide equivalent: 0.095 mol/100 g)

(n ≈ 2 (average value))

Maleimide (A1-5)

To 350 g of N-methylpyrrolidone, 252 g (1.0 mol) of KAYAHARD AA (manufactured by Nippon Kayaku Co., Ltd.) and 207 g (0.9 mol) of pyromellitic anhydride were added, stirred at room temperature for 3 hours, and further stirred at 120° C. for 3 hours. To the resulting solution, 196 g (2.0 mol) of maleic anhydride, 82 g (1.0 mol) of sodium acetate, and 204 g (2.0 mol) of acetic anhydride were added and stirred at 80° C. for 1 hour. Then, 500 g of toluene was added, followed by washing with water and dehydration. Subsequently, the solvent was distilled off under reduced pressure to obtain bismaleimide (A1-5) shown by the following formula (molecular weight: 1800, maleimide equivalent: 0.110 mol/100 g).

(n ≈ 3 (average value))

(A1-5)

Maleimide (A1-6)

A maleimide compound shown by the following formula (BMI-2300: manufactured by Daiwa Fine Chemicals Co., Ltd., molecular weight: 400, maleimide equivalent: 0.500 mol/100 g)

(n ≈ 1 (average value))

(A1-6)

(A2-1) Dicumyl peroxide "PERCUMYL D" (manufactured by NOF Corporation)

(A2-2) t-Butylperoxy-2-ethylhexylcarbonate "PERBUTYL E" (manufactured by NOF Corporation)

(A2-3) Triphenylphosphine (manufactured by KISHIDA CHEMICAL Co., Ltd.)

(B-1) Scaly boron nitride particles "MGP" (manufactured by Denka Company Limited, average particle diameter: 10 μm)

(B-2) Scaly boron nitride particles "Flakes 250-3" (manufactured by 3M, average particle diameter: 500 μm)

(B-3) Scaly boron nitride particles "UHP-S2" (manufactured by Showa Denko K.K., average particle diameter: 0.5 μm)

(B-4) Granular boron nitride particles "SGPS" (manufactured by Denka Company Limited, average particle diameter: 12 μm)

(C-1) Epoxy resin "FOLDI-E201" (manufactured by Nissan Chemical Corporation)

(C-2) Phenylene ether resin "SA9000" (manufactured by SABIC)

(C-3) Epoxy resin "jER-828" (manufactured by Mitsubishi Chemical Corporation)

[Preparation of Cured Materials]

According to the blending ratios shown in Table 1, the components (A1) and (A2) were mixed while being heated to 60° C. A mold having a length of 30 mm, a width of 40 mm, and a thickness of 100 μm was filled with the mixture, which was then cured at 180° C. for 2 hours.

Moreover, according to the blending ratios shown in Table 1, the components (A) and (B), or the components (A) to (C), were mixed, kneaded at 70° C. using a double hot roll, and then pulverized. A mold having a length of 10 cm, a width of 10 cm, and a thickness of 10 cm was filled with the pulverized material, which was then hot pressed at 180° C. for 2 hours and cured. The resulting cured material was cut to a predetermined thickness to prepare a low-dielectric heat dissipation film.

[Relative Dielectric Constant Measurement]

The prepared cured product was connected to a network analyzer (E5063-2D5 manufactured by Keysight Technologies) and a strip line (manufactured by Keycom Corporation) to measure the relative dielectric constant of the cured material of the component (A). Table 1 below shows the result.

Moreover, the prepared low-dielectric heat dissipation film was fully cured at 180° C. for 2 hours to prepare a cured material of the low-dielectric heat dissipation film. The relative dielectric constant was similarly measured. Table 1 below shows the result.

[Heat Conductivity Measurement]

The cured materials of the low-dielectric heat dissipation films obtained in Examples 1 to 7 and Comparative Examples 1 to 3 were each punched out to have a diameter of 1 cm, and the entire surface was coated with carbon black. This was used as a test piece to measure the heat conductivity in accordance with JIS R 1611: 2010 by laser flash method (LFA 447 Nanoflash manufactured by Netzsch Geratebau GmbH). Table 1 below shows the result.

TABLE 1

|   |   |   |   | Example 1 | Example 2 | Example 3 | Example 4 | Example 5 |
|---|---|---|---|---|---|---|---|---|
| (A) | (A1) | (A1-1) 0.057 | | 20 | — | — | — | 20 |
|   |   | (A1-2) 0.050 | | — | 15 | — | — | — |
|   |   | (A1-3) 0.062 | | — | — | 30 | — | — |
|   |   | (A1-4) 0.095 | | — | — | — | 20 | — |
|   |   | (A1-5) 0.110 | | — | — | — | — | — |
|   |   | (A1-6) 0.500 | | — | — | — | — | — |
|   | (A2) | (A2-1) | | 0.2 | — | — | 0.2 | 0.3 |
|   |   | (A2-2) | | — | 0.15 | — | — | — |
|   |   | (A2-3) | | — | — | 0.3 | — | — |
| (B) |   | (B-1) | | 80 | — | — | 80 | — |
|   |   | (B-2) | | — | 85 | — | — | 70 |
|   |   | (B-3) | | — | — | 70 | — | — |
|   |   | (B-4) | | — | — | — | — | — |
| (C) |   | (C-1) | | — | — | — | — | 10 |
|   |   | (C-2) | | — | — | — | — | — |
|   |   | (C-3) | | — | — | — | — | — |
| Evaluation results | Relative dielectric constant of cured component (A) | | 10 GHz | 2.8 | 2.9 | 2.6 | 3.4 | 2.8 |
|   | Relative dielectric constant of cured low-dielectric heat dissipation film | | 10 GHz | 3.7 | 3.9 | 3.4 | 4.2 | 4.0 |
|   | Heat conductivity (thickness direction) | | W/m·K | 8.8 | 10.0 | 7.1 | 8.6 | 7.4 |
|   | Heat conductivity (plane direction) | | W/m·K | 4.5 | 3.2 | 5.4 | 4.2 | 5.6 |

|   |   |   |   | Example 6 | Example 7 | Comparative Example 1 | Comparative Example 2 | Comparative Example 3 |
|---|---|---|---|---|---|---|---|---|
| (A) | (A1) | (A1-1) 0.057 | | 17 | — | — | — | — |
|   |   | (A1-2) 0.050 | | — | — | — | — | — |
|   |   | (A1-3) 0.062 | | — | 10 | — | — | — |
|   |   | (A1-4) 0.095 | | — | 5 | — | — | — |
|   |   | (A1-5) 0.110 | | — | — | 20 | — | — |
|   |   | (A1-6) 0.500 | | — | — | — | 20 | — |
|   | (A2) | (A2-1) | | 0.2 | — | — | 0.2 | — |
|   |   | (A2-2) | | — | — | 0.2 | — | — |
|   |   | (A2-3) | | — | 0.15 | — | — | 0.2 |
| (B) |   | (B-1) | | — | 75 | 80 | — | 80 |
|   |   | (B-2) | | 50 | — | — | 10 | — |
|   |   | (B-3) | | — | 10 | — | — | — |
|   |   | (B-4) | | 30 | — | — | 70 | — |
| (C) |   | (C-1) | | — | — | — | — | — |
|   |   | (C-2) | | 3 | — | — | — | — |
|   |   | (C-3) | | — | — | — | — | 20 |
| Evaluation results | Relative dielectric constant of cured component (A) | | 10 GHz | 2.7 | 3.2 | 3.8 | 4.7 | 5.0 |
|   | Relative dielectric constant of cured low-dielectric heat dissipation film | | 10 GHz | 3.7 | 4.0 | 4.7 | 5.1 | 4.8 |

TABLE 1-continued

| | | | | | | |
|---|---|---|---|---|---|---|
| Heat conductivity (thickness direction) | W/m·K | 10.0 | 9.2 | 9.5 | 8.2 | 8.5 |
| Heat conductivity (plane direction) | W/m·K | 5.6 | 4.0 | 5.1 | 7.5 | 4.4 |

The numbers on the right side of (A1-1) to (A1-6) show the maleimide equivalents (mol/100 g) of the maleimide resins.

As shown in Table 1, the inventive low-dielectric heat dissipation films have low relative dielectric constant and high heat conductivity. These properties make the inventive films useful as heat dissipation films compatible with high frequency.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A low-dielectric heat dissipation film composition comprising the following components (A), (B), and (C):
   (A) a maleimide resin composition containing the following components (A1) and (A2),
      (A1) a maleimide resin containing at least two or more maleimide groups per molecule, and
      (A2) a polymerization initiator; and initiator;
   (B) boron nitride particles; and
   (C) a phenylene ether resin containing a structure shown by the following formula (2):

(2)

wherein $R^1$ to $R^8$ each independently represent a hydrogen atom or a group selected from a saturated hydrocarbon group having 1 to 12 carbon atoms and an aromatic hydrocarbon group having 6 to 12 carbon atoms; n' represents an integer of 1 to 30; m' represents an integer of 0 to 30; and X represents a group selected from a single bond and a saturated hydrocarbon group having 1 to 12 carbon atoms,
   wherein the component (A1) has a maleimide equivalent of not more than 0.1 mol/100 g, and
   a cured material of the component (A) has a relative dielectric constant of 3.5 or less at a frequency of 10 GHz.

2. The low-dielectric heat dissipation film composition according to claim 1, wherein the boron nitride particles of the component (B) comprise boron nitride particles with hexagonal crystal structure.

3. The low-dielectric heat dissipation film composition according to claim 1, wherein the maleimide resin of the component (A1) has a main chain containing an alkylene chain or an arylene chain with 12 or more carbon atoms.

4. The low-dielectric heat dissipation film composition according to claim 2, wherein the maleimide resin of the component (A1) has a main chain containing an alkylene chain or an arylene chain with 12 or more carbon atoms.

5. The low-dielectric heat dissipation film composition according to claim 1, wherein
   the boron nitride particles of the component (B) have a ratio Ia/Ic of 0.25 or more,
   Ia represents an intensity in an a-axis direction (100 plane), and
   Ic represents an intensity in a c-axis direction (002 plane), Ia and Ic being measured using an X-ray diffractometer.

6. The low-dielectric heat dissipation film composition according to claim 2, wherein
   the boron nitride particles of the component (B) have a ratio Ia/Ic of 0.25 or more,
   Ia represents an intensity in an a-axis direction (100 plane), and
   Ic represents an intensity in a c-axis direction (002 plane), Ia and Ic being measured using an X-ray diffractometer.

7. The low-dielectric heat dissipation film composition according to claim 3, wherein
   the boron nitride particles of the component (B) have a ratio Ia/Ic of 0.25 or more,
   Ia represents an intensity in an a-axis direction (100 plane), and
   Ic represents an intensity in a c-axis direction (002 plane), Ia and Ic being measured using an X-ray diffractometer.

8. The low-dielectric heat dissipation film composition according to claim 4, wherein
   the boron nitride particles of the component (B) have a ratio Ia/Ic of 0.25 or more,
   Ia represents an intensity in an a-axis direction (100 plane), and
   Ic represents an intensity in a c-axis direction (002 plane), Ia and Ic being measured using an X-ray diffractometer.

9. A low-dielectric heat dissipation film comprising a material formed from the low-dielectric heat dissipation film composition according to claim 1.

10. The low-dielectric heat dissipation film according to claim 9, wherein the low-dielectric heat dissipation film has different heat conductivities in a plane direction and in a thickness direction by 0.5 W/m K or more.

* * * * *